(12) United States Patent
Dong et al.

(10) Patent No.: US 6,515,573 B1
(45) Date of Patent: Feb. 4, 2003

(54) METHOD AND SYSTEM FOR PROVIDING EDGE-JUNCTION TMR UTILIZING A HARD MAGNET AS A PINNED LAYER

(75) Inventors: Zi-Wen Dong, Fremont, CA (US); Zhupei Shi, San Jose, CA (US); Qunwen Leng, San Jose, CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/596,798

(22) Filed: Jun. 19, 2000

(51) Int. Cl.[7] .................... H01L 43/00; H01L 43/02; H01L 43/04; H01L 43/06; H01L 43/08; H01L 43/10

(52) U.S. Cl. ............ 338/32 R; 360/113; 360/324

(58) Field of Search ............... 338/32 R; 360/113, 360/126, 324; 428/161, 163, 164

(56) References Cited

U.S. PATENT DOCUMENTS 5,793,279 A * 8/1998 Nepela ............... 338/33 R
5,894,385 A * 4/1999 Gill et al. ............... 360/113
6,004,654 A * 12/1999 Shinjo et al. ............ 428/161

* cited by examiner

*Primary Examiner*—Elvin Enad
*Assistant Examiner*—Kyung Lee
(74) *Attorney, Agent, or Firm*—Sawyer Law Group LLP

(57) ABSTRACT

A method and system for providing a magnetoresistive sensor for reading data from a recording media is disclosed. The method and system include providing at least one barrier layer and a free layer having at least one edge. The at least one edge of the free layer is adjacent to the at least one barrier layer. The free layer is ferromagnetic and has a low coercivity. The method and system also include providing at least one hard magnetic layer. The at least one hard magnetic layer has a coercivity greater than the free layer coercivity. The at least one barrier layer is disposed between the at least one hard magnetic layer and the free layer. The at least one barrier layer is sufficiently thin to allow tunneling of charge carriers between the at least one hard magnetic layer and the free layer.

10 Claims, 9 Drawing Sheets

METHOD AND SYSTEM FOR PROVIDING EDGE-JUNCTION TMR UTILIZING A HARD MAGNET AS A PINNED LAYER

CROS-REFERENCE TO RELATED APPLICATIONS

The present invention is related to co-pending U.S. patent application Ser. No. 09/523,025 filed on Mar. 10, 2000 now a U.S. Pat. No. 6,445,554 entitled "METHOD AND SYSTEM FOR PROVIDING EDGE-JUNCTION TMR FOR HIGH AREAL DENSITY MAGNETIC RECORDING" and assigned to the assignee of the present application.

FIELD OF THE INVENTION

The present invention relates to magnetic recording, and more particularly to a method and system for providing a tunneling magnetoresistance recording junction suitable for high areal density magnetic recording.

BACKGROUND OF THE INVENTION

Tunneling magnetoresistive ("TMR") junctions have recently become of interest for potential use in reading recording media in a magnetoresistive ("MR") head. FIG. 1A depicts diagrams of a conventional TMR sensor 10 as viewed from the side. FIG. 1A depicts the shields first and second shields 24 and 26, first and second gaps 20 and 22, leads 11 and 19, and the TMR sensor 10.

FIG. 1B depicts the conventional TMR sensor 10 as viewed from the side and from an air-bearing surface or magnetic material with which the TMR sensor 10 is being used. In addition to the TMR sensor 10, FIG. 1B depicts leads 11 and 19 and first and second gaps 20 and 22, respectively. Not depicted in FIG. 1B are conventional shields 24 and 26, which partially surround the conventional TMR sensor 10. The conventional TMR sensor 10 includes a conventional antiferromagnetic ("AFM") layer 12, a conventional pinned layer 14, a conventional barrier layer 16, and a conventional free layer 18. The TMR junction for the TMR sensor 10 includes the interfaces between the conventional pinned layer 14, the conventional barrier layer 16 and the conventional free layer 18. Also depicted are portions of gaps 20 and 22 that surround a portion of the TMR sensor 10. The conventional pinned layer 14 and conventional free layer 18 are ferromagnetic. The conventional pinned layer 14 has its magnetization fixed, or pinned, in place because the conventional pinned layer 14 is magnetically coupled to the conventional AFM layer 12. The conventional antiferromagnetic layer 12 is approximately one hundred to three hundred Angstroms thick. The conventional pinned layer 14 is approximately twenty to one hundred Angstroms thick. The conventional barrier layer 16 is typically five to twenty Angstroms thick and the conventional free layer 18 is typically thirty to one hundred Angstroms thick.

The magnetization of the conventional free layer 18 of the TMR sensor 10 is biased in the plane of the page when there is no external magnetic field, but is free to rotate in response to an external magnetic field. The conventional free layer 18 is typically composed of Co, $Co_{90}Fe_{10}$, or a bilayer of $Co_{90}Fe_{10}$ and permalloy. The magnetization of the conventional pinned layer 14 is pinned perpendicular to the plane of the page. The conventional pinned layer 14 is typically composed of Co, Fe, or Ni. The conventional barrier layer 16 is typically composed of aluminum oxide ($Al_2O_3$).

For the conventional TMR sensor 10 to function, a bias current is driven between the leads 11 and 19, perpendicular to the plane of the layers 12, 14, 16 and 18 of the conventional TMR sensor 10. Thus, the TMR sensor 10 is known as a current perpendicular to the plane ("CPP") junction. The direction of flow of the bias current is depicted by the arrow 24. The MR effect in the conventional TMR sensor 10 is believed to be due to spin polarized tunneling of electrons between the conventional free layer 18 and the conventional pinned layer 14. Thus, spin polarized electrons tunnel through the conventional barrier layer 16 in order to provide the magnetoresistive effect. When the magnetization of the conventional free layer 18 is parallel or antiparallel to the magnetization of the conventional pinned layer 14, the resistance of the conventional TMR sensor 10 is minimized or maximized, respectively. In addition, the magnetization of the conventional free layer 18 is biased to be. perpendicular to the magnetization of the conventional pinned layer 14 when no external field is applied, as depicted in FIG. 1B. The magnetoresistance, MR, of a MR sensor is the difference between the maximum resistance and the minimum resistance of the MR sensor. The MR ratio of the MR sensor is typically called $\Delta R/R$, and is typically given as a percent. A typical magnetoresistance of the conventional TMR sensor is approximately twenty percent.

FIG. 1C depicts another conventional TMR sensor 10'. The conventional TMR sensor 10' is substantially the same as the conventional TMR sensor 10. Consequently, the components of the conventional TMR sensor 10' are labeled similarly. For example, the conventional free layer is denoted as 18'. However, the conventional pinned layer 14 has been replaced by the conventional hard magnetic layer 14'. The conventional hard magnetic layer has a high coercivity, significantly greater than the tens of Oersteds that could be the coercivity of the conventional free layer 18'. Although not depicted, an AFM layer, such as the AFM layer 12 could be utilized in the TMR sensor 10' to ensure that the magnetization of the conventional hard magnetic layer 14' is pinned in the desired direction.

The conventional TMR sensors 10 and 10' are of interest for MR sensors for high areal density recording applications. Currently, higher recording densities, for example over fifty gigabits ("Gb") per square inch, are desired. When the recording density increases, the size of and magnetic field due to the bits decrease. Consequently, the bits provide a lower signal to a read sensor. In order to maintain a sufficiently high signal within a MR read head, the signal from the read sensor for a given magnetic field is desired to be increased. One mechanism for increasing this signal would be to use an MR sensor having an increased MR ratio. The conventional TMR sensors 10 and 10' can have an MR of approximately twenty percent, which is higher than a conventional giant magnetoresistance ("GMR") sensor having a nonmagnetic conducting layer separating a free layer and a pinned layer. Furthermore, the conventional TMR sensors 10 and 10' have a smaller thickness than a conventional GMR sensor, allowing for a smaller spacing between shields (not shown). The smaller spacing between shields allows for more effective shielding of bits not desired to be read by the TMR sensor 10. The width of the conventional TMR sensors 10 and 10', shown is in FIGS. 1B and 1C, can be narrower than a conventional GMR sensor. This also aids in allowing the conventional TMR sensor 10 to read smaller bits at higher recording densities.

Although the conventional TMR sensors 10 and 10' are of interest for high-density recording applications, one of ordinary skill in the art will readily realize that there are several drawbacks to the conventional TMR sensors 10 and 10'. Some of these drawbacks are due to the area of the conventional TMR sensor 10. In particular, the conventional TMR sensors 10 and 10' often have a nonuniform bias current and may have a reduced MR ratio due to the large area of the TMR sensors 10 and 10'. The area of the conventional TMR junction includes the area of the interfaces between the conventional pinned layer 14 or conventional hard magnetic layer 14', the conventional free layer 18 or 18', respectively, and the conventional barrier layer 16 or 16', respectively. The junction area is defined by the width of the conventional TMR sensor 10 or 10', w, depicted in FIGS. 1B and 1C, and the lengths of the conventional TMR sensors 10 and 10' into the plane of the page depicted in FIGS. 1B and 1C. The length of the conventional TMR sensors 10 and 10' are determined by the stripe height, h, of the conventional TMR sensor 10 or 10' as depicted in FIG. 1A. The width w of the conventional TMR sensor 10 or 10' is determined by the track width (not shown) of the media desired to be read and is typically approximately half of the track width. Thus, the junction area for the conventional TMR sensor 10 is the width multiplied by the stripe height (w×h). The area of the conventional TMR junction for the conventional TMR sensor 10 or 10' is typically on the order of one quarter of a square micrometer. As discussed above, the conventional barrier layer 16 or 16' is typically between five and twenty Angstroms thick. Because the conventional barrier layer 16 or 16' has such a large area but is so thin, pinholes (not shown in FIGS. 1A–1C) often exist in the conventional barrier layer 16 or 16'. Current more easily flows between the conventional pinned layer 14 or the conventional hard magnetic layer 14' and the conventional free layer 18 or 18', respectively, through these pinholes than through the conventional barrier layer 16 or 16', respectively. As a result, the bias current between the leads 11 and 19 or the leads 11' and 19' is nonuniform. In addition, because electrons pass readily through these pinholes, the electrons do not undergo spin polarized tunneling. As a result, the MR effect for the conventional TMR sensors 10 and 10' can be reduced by the electrons which pass through the pinholes instead of tunneling through the conventional barrier layers 16 and 16', respectively. Consequently, not only may the bias current lack uniformity, but the MR ratios for the conventional TMR sensors 10 and 10' may also be reduced below the intrinsic percentage (approximately twenty percent).

There are further drawbacks to use of the conventional TMR sensors 10 and 10'. The conventional free layers 18 and 18', the conventional barrier layers 16 and 16', respectively, and the conventional pinned layer 14 and the conventional hard magnetic layer 14', respectively, are two metallic layers separated by an insulating layer. As a result, the conventional free layers 18 and 18', the conventional barrier layer 16 and 16', respectively, and the conventional pinned layer 14 and the conventional hard magnetic layer 14', respectively, form a parasitic capacitor. In part because of the large junction area, the ziiro parasitic capacitances of the conventional TMR sensors 10 and 10' are relatively large. A parasitic capacitance slows the responses of the conventional TMR sensors 10 and 10'. The characteristic time constant for these delays are proportional to the capacitances of the TMR sensor 10 and 10'. Because the capacitances are larger than desired, the delays are larger than desired. As a result, the responses of the conventional TMR sensor 10 and 10' are relatively slow and result in slow data transfer rates.

In addition, the conventional TMR sensors 10 and 10' are fabricated and used in the CPP orientation. Typical conventional GMR. sensor are fabricated such that a bias current can be driven parallel to the plane of the layers of the conventional GMR sensor. In other words, the conventional GMR sensor is fabricated and used in a current in plane ("CIP") configuration. As a result, it may be difficult to fabricate the conventional TMR sensors 10 and 10' using methods developed for the conventional GMR sensor. As a result, the conventional TMR sensors 10 and 10' may be relatively difficult to manufacture. Moreover, although the intrinsic MR ratio for the conventional TMR sensors 10 and 10' are higher than for a conventional GMR sensor, a higher practical MR ratio is still desired.

Furthermore, fabrication of the air-bearing surface ("ABS") for the conventional TMR sensors 10 and 10' may short the conventional TMR sensors 10 and 10'. In particular, the ABS is typically lapped during fabrication. The lapping takes place perpendicular to the plane of the layers in the-conventional TMR sensors 10 and 10'. For example, lapping typically takes-place parallel and antiparallel to the directions of current 24 and 24' in FIGS. 1A and 1B, respectively. Therefore, the conventional pinned layer 14 and the conventional free layer 18 of the conventional TMR sensor 10, as well as the conventional hard magnetic layer 14' and the conventional free layer 18' of the conventional TMR sensor 10' may be smeared over the conventional barrier layers 16 and 16', respectively. These magnetic layers 14, 14', 16 and 16' are conductive. The smearing of the layers 14, 14', 16 and 16' may thus short the conventional TMR sensors 10 and 10'. Consequently, yield is reduced.

With respect to the conventional TMR sensor 10', there is an additional drawback. The conventional hard magnetic layer 14' is typically magnetically coupled to the conventional free layer 18'. Because of the small thickness of the conventional barrier layer 16', this coupling is usually antiferromagnetic in nature. However, the conventional hard magnetic layer 16' may also be paramagnetically coupled to the conventional free layer 18'. It is also desirable for the conventional free layer 18' to freely respond to an external magnetic field. Therefore, a magnetic coupling between the free layer 18' and the conventional hard magnetic layer 14' greatly reduces the freedom of the free layer 18' to rotate in response to an external magnetic field such as the field from recording bits, which is undesirable.

When an AFM layer, such as the AFM layer 12, is used with the conventional TMR sensor 10 or 10', there are additional drawbacks. As the TMR sensors 10 or 10' are used to read media having a higher areal density, the operating temperature of the device typically increases. Locally, the operating temperature of such devices can be on the order of two hundred to four hundred degrees Celsius, or higher. These operating temperatures are on the order of the blocking temperatures of materials such as IrMn and PtMn, which are typically used for the AFM layer 12. Thus, the AFM layer 12 will lose its ability to pin the conventional pinned layer 14 or the conventional hard magnetic layer 14' during operation of the device. Moreover, these AFM materials are often corrosive in nature, leading to failures of the conventional TMR junctions 10 and 10'. Furthermore, during manufacturing the conventional TMR sensor 10 or 10' is heated in order to allow the conventional AFM layer 12 to pin the conventional pinned layer 14 or the conventional hard magnetic layer 14'. The TMR sensor 10 or 10' is typically heated to a temperature slightly above the blocking temperature of the conventional AFM layer 12, for example between approximately two hundred and four hundred degrees. Heating the entire conventional TMR sensor 10 or 10' to such a temperature may induce inter-diffusion between the layers of the conventional TMR sensor 10 or 10', which also can degrade performance.

Accordingly, what is needed is a system and method for providing a manufacturable TMR junction that is capable of being used in high-density magnetic recording. The present invention addresses such a need.

SUMMARY OF THE INVENTION

The present invention provides a method and system for providing a magnetoresistive sensor for reading data from a recording media. The method and system comprise providing at least one barrier layer and a free layer having at least one edge. The at least one edge of the free layer is adjacent to the at least one barrier layer. The free layer is ferromagnetic and has a free layer coercivity. The method and system also comprise providing at least one hard magnetic layer. The at least one hard magnetic layer has a coercivity greater than the free layer coercivity. The at least one barrier layer is disposed between the at least one hard magnetic layer and the free layer. The at least one barrier layer is sufficiently thin to allow tunneling of charge carriers between the at least one hard magnetic layer and the free layer.

According to the system and method disclosed herein, the present invention provides a magnetoresistive sensor that has a higher magnetoresistive ratio, is relatively simple to fabricate, which is less subject to nonuniform bias current, does not require an antiferromagnetic inning layer and which is suitable for high areal density recording applications.

DETAILED DESCRIPTION OF THE INVENTION

The present invention relates to an improvement in magnetic recording technology. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional TMR sensors are of interest for high areal density recording applications. For example, current conventional TMR sensors are of interest for reading materials recorded at a density of on the order of fifty $Gb/in^2$ and higher. However, one of ordinary skill in the art will readily realize that there are several drawbacks to conventional TMR sensors. Conventional TMR sensors have a large junction area and, therefore, are subject to pinholes that cause a nonuniform bias currents and a reduced MR ratio. In addition, conventional TMR sensors have a relatively large capacitance, which causes a slower response and lower data transfer rates. Moreover, a higher signal from the MR ratio of the sensor is still desired, particularly for higher densities of over fifty $Gb/in^2$, including a recording density of one hundred $Gb/in^2$. In addition, use of an antiferromagnetic layer in the conventional TMR sensors has additional drawbacks. The materials used for the AFM layer typically have a blocking temperature which is on the order of the local operating temperature of the device using the TMR sensor, are typically corrosive in nature, and require annealing at a temperature which may induce inter-diffusion between the layers of the TMR sensor.

Figure 2:
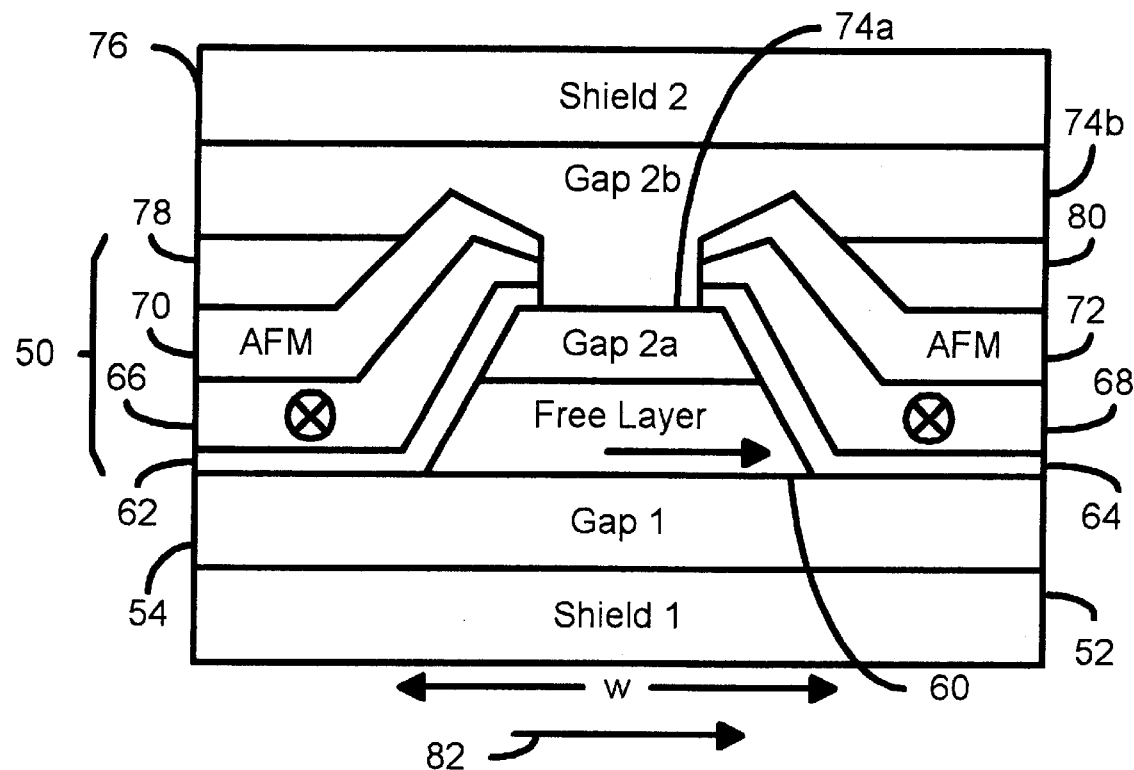
FIG. 2 is an air-bearing surface view of a recently developed TMR sensor.

In addition to the conventional TMR sensors described above, a newer TMR sensor has recently been developed. FIG. 2 is an air-bearing surface view of a recently developed TMR sensor 50. The recently developed TMR sensor 50 is described in more detail in copending U.S. patent application Ser. No. 09/523,025 filed on Mar. 10, 2000 now a U.S. Pat. No. 6,445,554 entitled "METHOD AND SYSTEM FOR PROVIDING EDGE-JUNCTION TMR FOR HIGH AREAL DENSITY MAGNETIC RECORDING" and assigned to the assignee of the present application. Applicant hereby incorporates by reference the above-identified co-pending patent application.

The recently developed TMR sensor 50 is surrounded by first gap 54, second gap 74, first shield 52, second shield 76, and leads 78 and 80. Note that the second gap 74 is depicted as having two separate portions, the second gap A 74a and the second gap B 74b. The recently developed TMR sensor 50 includes a free layer 60, a first barrier layer 62, a second barrier layer 64, a first pinned layer 66, a second pinned layer 68, a first pinning or antiferromagnetic ("AFM") layer 70 and a second pinning or AFM layer 72. In addition, a seed layer may be provided between the free layer 60 and the first gap 54. Such a seed layer would preferably be composed of a tantalum layer having a thickness of approximately twenty to fifty Angstroms. A capping layer may also be provided between the free layer 60 and the second gap a 74a. Such a capping layer is preferably formed of tantalum having a thickness of approximately twenty to fifty Angstroms.

The free layer 60 is ferromagnetic and is preferably free to respond to an external magnetic field. The pinned layers 66 and 68 are magnetic and are magnetically coupled to the AFM layers 70 and 72, respectively. The materials used in the pinned layers 66 and 68 and the free layer 60 are preferably selected to increase the MR ration for the TMR junction 50. The MR ratio for a TMR junction is proportional to $2P1P2/(1+P1P2)$, where P1 and P2 are the spin polarizations of the free layer and pinned layer, respectively, for the junction. The spin polarizations are typically expressed as a percentage. Thus, the materials for the pinned layers 66 and 68 and the free layer 60 are preferably selected to have a higher spin polarization, resulting in a higher MR ratio. Note, however, that the materials used in free layer 60 should also be selected to have a low coercivity, allowing the free layer 60 to easily respond to an external magnetic field.

The first and second barrier layers 62 and 64 are preferably between approximately five and twenty Angstroms in thickness. The barrier layers 62 and 64 are thin enough to allow spin polarized tunneling of charge carriers (e.g. electrons) between the free layer 60 and the pinned layers 66 and 68, respectively. The barrier layers 62 and 64 preferably include oxide. The AFM layer 70 and 72 preferably include PtMn, MnFe or IrMn. Moreover, as depicted in FIG. 2, the magnetizations of the pinned layers 66 and 68 are preferably biased perpendicular to the magnetization of the free layer 60 in the absence of an external magnetic field. Thus, the magnetizations of the pinned layers 66 and 68 preferably point out of the plane of the page.

As depicted in FIG. 2, the recently developed TMR sensor 50 preferably includes two TMR junctions. One TMR junction is formed by the first pinned layer 66, the first barrier layer 62 and the free layer 60. The second TMR junction is formed by the second pinned layer 68, the second barrier layer 64 and the free layer 60. Thus, the TMR junctions for the recently developed TMR sensor 50 are preferably formed at the edges of the free layer 60. Because of the geometry of the TMR junctions for the recently developed TMR sensor 50, current is driven in the direction depicted by the arrow 82. Thus, the recently developed TMR sensor 50 is thus a current in plane ("CIP") sensor, similar to current GMR sensors.

Figure 1A:
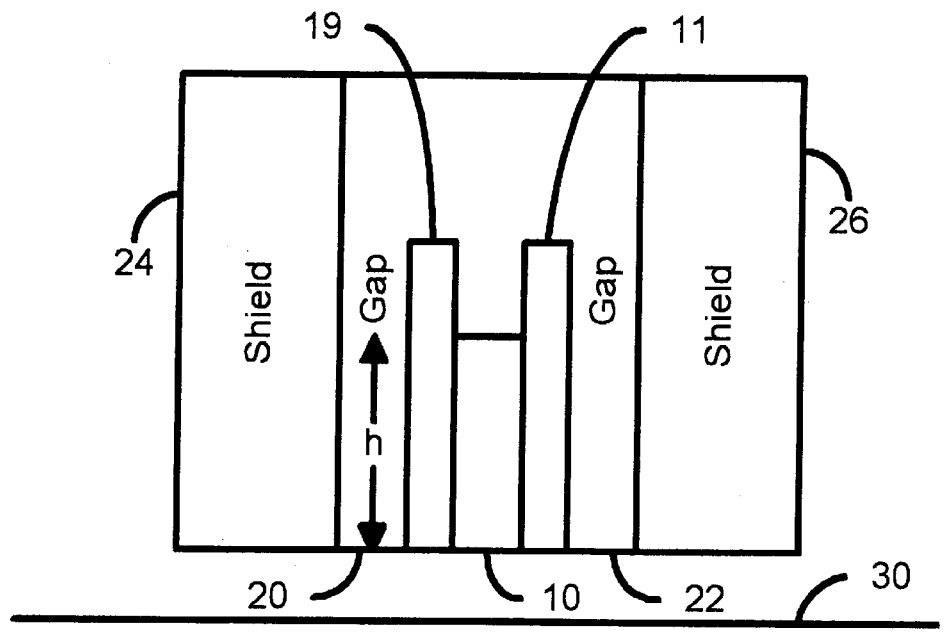
FIG. 1A is a side view of a conventional TMR sensor.
Figure 1B:
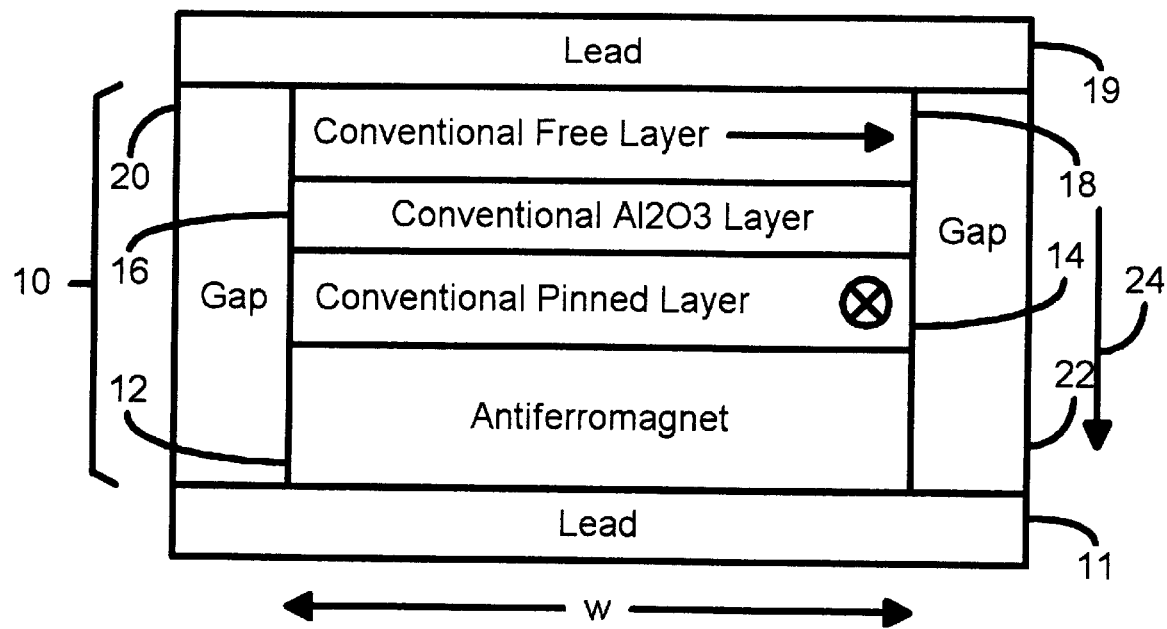
FIG. 1B is a diagram of the conventional TMR sensor as viewed from an air-bearing surface.

Because the TMR junctions for the recently developed TMR sensor 50 are at the edges of the free layer 60, the area of each TMR junction is significantly reduced. The area of each TMR junction is also decoupled from the width, w, of the free layer 60. The thickness of the free layer 60 is preferably on the order of approximately ten to three hundred Angstroms. Assuming the stripe height for the recently developed TMR sensor 50 is approximately the same as a conventional TMR sensor 10 or 10', the area for each of the TMR junctions in the recently developed TMR sensor 50 is substantially less than for the conventional TMR sensor 10 or 10'. This is significantly reduces the surface area of each TMR junction in the recently developed TMR sensor 50 from that of a conventional TMR sensor 10 or 10' depicted in FIGS. 1B and 1C.

Referring back to FIG. 2, because the areas of the TMR junctions in the recently developed TMR sensor 50 are greatly reduced, the recently developed TMR sensor 50 enjoys several advantages over a conventional TMR sensor 10 or 10'. The reduction in the areas of the TMR junctions for the recently developed TMR sensor 50 reduces the probability of pinholes in the barrier layers 62 and 64. As a result, the recently developed TMR sensor 50 has a more uniform bias current. In addition, there is a smaller probability of reduction in the MR ratio of the recently developed TMR sensor 50 due to the electrons passing through pinholes instead of tunneling through the barrier layers 62 and 64. Furthermore, the reduction in the TMR junction area also reduces the parasitic capacitance for the recently developed TMR sensor 50. As a result, the response time of the recently developed TMR sensor 50 is improved and the data transfer rate using the recently developed TMR sensor 50 can be increased. Furthermore, because the TMR junctions of the recently developed TMR sensor 50 have smaller areas, a smaller bias current can be used. For example, the conventional TMR sensor 10 or 10' depicted in FIGS. 1A–1C utilizes a bias current on the order of four to five milliamps. In contrast, the recently developed TMR sensor 50 may use a bias current of between ten and one hundred microamps. Use of a lower bias current allows the recently developed TMR sensor 50 to have reduced power dissipation, less sensor heating and lower Johnson thermal noise, which are desirable.

The recently developed TMR sensor 50 also has an increased signal. As discussed above, the recently developed TMR sensor 50 has two TMR junctions, one at each edge of the free layer 60. The bias current is also driven parallel to the plane of the page, in the direction depicted by arrow 82. This is because the bias current is driven between the leads 78 and 80 As a result, the current passes through two TMR junctions when traveling between the leads 78 and 80. Thus, the signal from the recently developed TMR sensor 50 may be twice what it would be for the conventional TMR sensor 10 or 10'. Therefore, the recently developed TMR sensor 50 is more suitable for higher density recording application.

In addition, the free layer 60 may be single domain, making magnetic biasing for the recently developed TMR sensor 50 unnecessary. If the free layer 60 is small enough, the free layer will be single domain. In general, a free layer 60 will be single domain if its width, w, approximately less than or equal to ten times the exchange length for the material of which the free layer 60 is made. For a free layer 60 that is made of permalloy (NiFe having approximately nineteen percent Fe), the free layer 60 will be single domain if the free layer 60 has a width that is less than or equal to approximately 0.1 micron. As a result, the free layer 60 can be single domain without magnetic biasing.

In addition to the above-mentioned benefits, the recently developed TMR sensor 50 is relatively simple to manufacture. This simplicity comes in part from the fact that the recently developed TMR sensor 50 is in a CIP configuration and can thus be manufactured using very similar techniques to conventional CIP GMR sensors. In other words, it is relatively simple to integrate the processing of the recently developed TMR sensor 50 into current processing technologies.

Although the recently developed TMR sensor 50 functions well for its intended purpose, the recently developed TMR sensor 50 does have drawbacks. In particular, the AFM layers 70 and 72 may adversely affect the recently developed TMR sensor 50. Materials typically used for the AFM layers 70 and 72, such as IrMn and PtMn, tend to be very corrosive. As a result, the AFM layers 70 and 72 can tend to make portions of the recently developed TMR sensor 50 corrode. This can adversely affect performance of the recently developed TMR sensor 50. In addition, the recently developed TMR sensor 50 is typically annealed during processing in order to ensure that the AFM layers 70 and 72 are magnetically coupled to the pinned layers 66 and 68. The annealing is performed at a temperature above the blocking temperature of the AFM layers 70 and 72. This temperature is typically on the order of two hundred to four hundred degrees Celsius or higher. During annealing, the layers 60, 62, 64, 66, 68, 70 and 72 could inter-diffuse. Inter-diffusion of the layers 60, 62, 64, 66, 68, 70 and 72 can adversely affect the performance of the recently developed TMR sensor 50. In addition, the blocking temperatures of the materials used for the AFM layers 70 and 72 are typically on the order of two hundred to four hundred degrees Celsius. When the recently developed TMR sensor 50 is used for reading higher areal density media, the local temperature of portions of the recently developed TMR sensor 50 can reach temperatures on the order of two hundred to four hundred degrees Celsius. Thus, temperatures on the order of the blocking temperature of the AFM layers 70 and 72 can be reached. When this occurs, the AFM layers 70 and 72 begin to lose the AFM properties. Thus, the AFM layers 70 and 72 may be unable to adequately pin the magnetizations of the pinned layers 66 and 68. As a result, the magnetizations of the pinned layers 66 and 68 may begin to respond to an external magnetic field. The MR ratio of the recently developed TMR sensor 50 will decrease. Thus, the performance of the recently developed TMR sensor 50 will degrade.

The present invention provides a method and system for providing a magnetoresistive sensor for reading data from a recording media. The method and system comprise providing at least one barrier layer and a free layer having at least one edge. The at least one edge of the free layer is adjacent to the at least one barrier layer. The free layer is ferromagnetic and has a low coercivity. The method and system also comprise providing at least one hard magnetic layer. The at least one hard magnetic layer has a coercivity much greater than the free layer coercivity. The at least one barrier layer is disposed between the at least one hard magnetic layer and the free layer. The at least one barrier layer is sufficiently thin to allow tunneling of charge carriers between the at least one hard magnetic layer and the free layer.

The present invention will be described in terms of particular embodiments of a TMR sensor. However, one of ordinary skill in the art will readily recognize that this method and system will operate effectively for alternate embodiments using other materials or having other components. In addition, the present invention is described in the context of particular methods for forming a TMR sensor in accordance with the present invention. However, one of ordinary skill in the art will readily recognize that the present invention is consistent with other methods employing different steps in alternate orders. Furthermore, although the TMR sensor in accordance with the present invention is depicted alone, the TMR sensor in accordance with the present invention could be used in a read head or a composite head capable of both reading and writing to media.

Figure 3A:
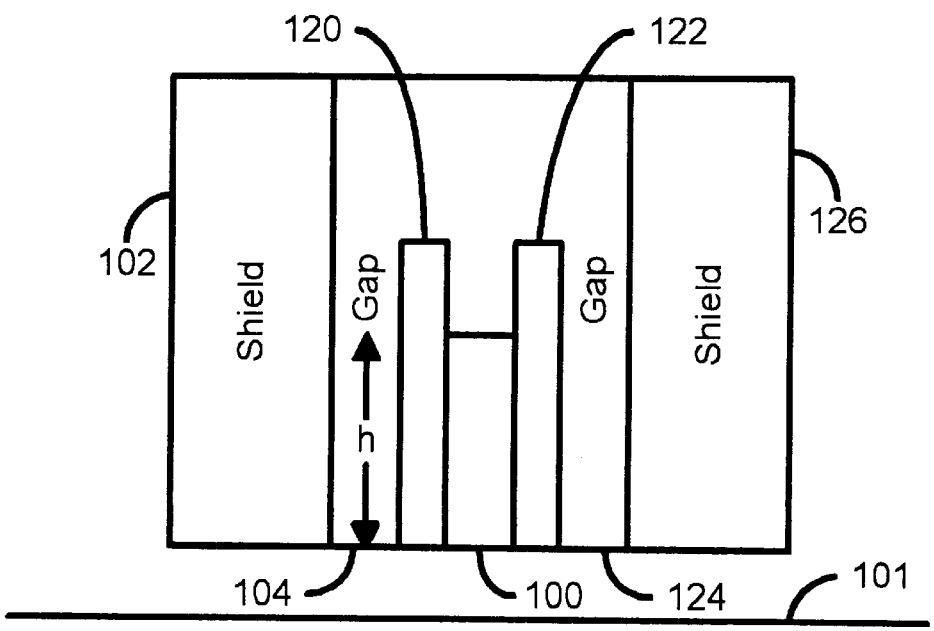
FIG. 3A is a side view of one embodiment of a TMR sensor in accordance with the present invention.
Figure 3B:
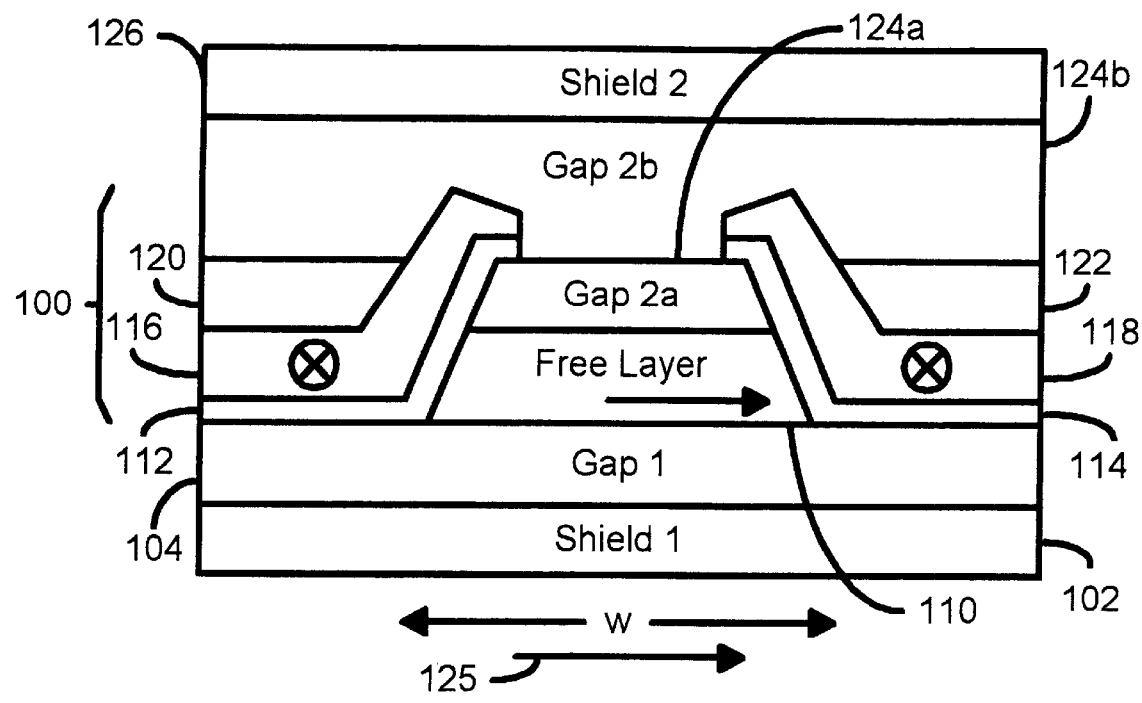
FIG. 3B is a diagram of one embodiment of the TMR sensor in accordance with the present invention as viewed from an air-bearing surface.

To more particularly illustrate the method and system in accordance with the present invention, refer now to FIGS. 3A and 3B, depicting a side view and air-bearing surface view, respectively, of a TMR sensor 100 in accordance with the present invention. FIG. 3A depicts the TMR sensor 100, first lead 120, second lead 122, first gap 104, second gap 124, first shield 102 and second shield 126. The stripe height, h, of the TMR sensor 100 and the air-bearing surface of the magnetic material 101 desired to be read are also depicted in FIG. 3A. The first shield 102 and second shield 126 are magnetically permeable and thus generally conductive. The first and second shields 102 and 126, respectively, shield the TMR sensor 100 from exposure to magnetic fields other than that of the bit (not explicitly indicated in FIG. 3A) in the magnetic material 101 that is desired to be read. The first gap 104 and the second gap 124 are typically insulators and electrically isolate the TMR sensor 100 from the shields 102 and 126. The first gap 104 is preferably on the order of one hundred to five hundred Angstroms in thickness and composed of aluminum oxide. The second gap 124 is preferably approximately one hundred to four hundred Angstroms in thickness and composed of aluminum oxide.

FIG. 3B depicts the TMR sensor 100 as viewed from the air bearing surface, or the magnetic material 101 shown in FIG. 3A. FIG. 3B depicts the TMR sensor 100, first gap 104, second gap 124, first shield 102, second shield 126, and leads 120 and 122. Note that the second gap 124 is depicted as having two separate portions, the second gap A 124a and the second gap B 124b. The TMR sensor 100 includes a free layer 110, a first barrier layer 112, a second barrier layer 114, a first hard magnetic layer 116 and a second hard magnetic layer 118. In addition, a seed layer may be provided between the free layer 110 and the first gap 104. Such a seed layer would preferably be composed of a tantalum layer having a thickness of approximately twenty to fifty Angstroms. A capping layer may also be provided between the free layer 110 and the second gap a 124a. Such a capping layer is preferably formed of tantalum having a thickness of approximately twenty to fifty Angstroms.

The free layer 110 is ferromagnetic and is preferably between approximately twenty and one hundred Angstroms. However, another thickness could be used. The free layer 110 preferably includes NiFe, Co, CoFe, Ni, or some combination thereof In one preferred embodiment, the free layer 110 is NiFe having approximately nineteen percent Fe.

The hard magnetic layers 116 and 118 are magnetic and preferably have a thickness between approximately thirty and one hundred Angstroms. However, other thicknesses could be used. The hard magnetic layers 116 and 118 may include materials. such as CoFe, CoCr, CoCrPt or some other hard magnetic material. The free layer 110 preferably has a low coercivity, on the order of a few Oersted. The hard magnetic layers 116 and 118 have a coercivity which is larger than the coercivity of the free layer. The hard magnetic layers 116 and 118 should have a coercivity which is significantly larger than that of the free layer. Preferably, the coercivity of the free layer 110 is less than ten Oersted and the coercivities of the hard magnetic layers 116 and 118 are greater than one hundred Oersted. In addition, the hard magnetic layers 116 and 118 preferably have a coercivity which is larger than any magnetic fields to which the TMR sensor 100, and the hard magnetic layers 116 and 118, will be exposed during operation.

In addition, the magnetizations of the hard magnetic layers 116 and 118 are preferably biased perpendicular to the magnetization of the free layer 110 in the absence of an external magnetic field. Thus, the magnetizations of the hard magnetic layers 116 and 118 are depicted as out of the plane of the page. The direction of magnetization of the hard magnetic layers 116 and 118 can be preset at room temperature by applying a large magnetic field, preferably eighteen thousand Oe, at the desired direction for a short time, preferably twenty seconds. Because the coercivity of the hard magnetic layers 116 and 118 is as described above, the magnetizations of the hard magnetic layers 116 and 118 should remain as biased during operation of the TMR sensor 100. Thus, the magnetizations of the hard magnetic layers 116 and 118 are effectively pinned due to the high coercivities of the hard magnetic layers 116 and 118. Consequently, no AFM layer is required to bias the magnetizations of the hard magnetic layers 116 and 118.

The materials used in the hard magnetic layers 116 and 118 and the free layer 110 are also preferably, selected to increase the MR ratio for the TMR junction 100. The MR ratio for a TMR junction is proportional to $2P1P2/(1+P1P2)$, where P1 and P2 are the spin polarizations of the free layer and hard magnetic layer, respectively, for the junction. The spin polarizations are typically expressed as a percentage. Thus, the materials for the hard magnetic layers 116 and 118 and the free layer 110 are preferably selected to have a higher spin polarization, resulting in a higher MR ratio. However, as discussed above, the materials used in free layer 110 should also be selected to have a low coercivity, allowing the free layer 110 to easily respond to an external magnetic field.

The first and second barrier layers 112 and 114, respectively, are preferably between approximately five and twenty Angstroms in thickness. The barrier layers 112 and 114 are thin enough to allow spin polarized tunneling of charge carriers (e.g. electrons) between the free layer 110 and the hard magnetic layers 116 and 118, respectively. The barrier layers 112 and 114 preferably include aluminum oxide.

As depicted in FIG. 3B, the TMR sensor 100 preferably includes two TMR junctions. One TMR junction is formed by the first hard magnetic layer 116, the first barrier layer 112 and the free layer 110. The second TMR junction is formed by the second hard magnetic layer 118, the second barrier layer 114 and the free layer 110. Thus, the TMR junctions for the TMR sensor 100 are preferably formed at the edges of the free layer 110. Because of the geometry of the TMR junctions for the TMR sensor 100, current is driven in the direction depicted by the arrow 125. Thus, the TMR sensor 100 is thus a current in plane ("CIP") sensor, similar to current GMR sensors.

Because the TMR junctions for the TMR sensor 100 are at the edges of the free layer 110, the area of each TMR junction is significantly reduced. As can be seen in FIG. 3B; the area of each TMR junction is the thickness of the free layer 110 multiplied by the stripe height, h, which is into the plane of the page in FIG. 3B. Thus, the area of each TMR junction is decoupled from the width, w, of the free layer 110. The thickness of the free layer 110 is preferably on the order of approximately ten to three hundred Angstroms. Assuming the stripe height for the TMR sensor 100 is approximately the same as a conventional TMR sensor 10, the area for each of the TMR junctions in the TMR sensor 100 is substantially less than for the conventional TMR sensor 10. This is significantly reduces the surface area of each TMR junction in the TMR sensor from that of a conventional TMR sensor 10 or 10' depicted in FIGS. 1A–1C.

Referring back to FIGS. 3A and 3B, because the areas of the TMR junctions in the TMR sensor 100 are greatly reduced, the TMR sensor 100 enjoys several advantages over a conventional TMR sensor 10. The reduction in the areas of the TMR junctions for the TMR sensor 100 reduces the probability of pinholes in the barrier layers 112 and 114. As a result, the TMR sensor 100 has a more uniform bias current. In addition, there is a smaller probability of reduction in the MR ratio of the TMR sensor 100 due to the electrons passing through pinholes instead of tunneling through the barrier layers 112 and 114. Furthermore, the reduction in the TMR junction area also reduces the parasitic capacitance for the TMR sensor 100. As a result, the response time of the TMR sensor 100 is improved and the data transfer rate using the TMR sensor 100 can be increased. Furthermore, because the TMR junctions of the TMR sensor 100 have smaller areas, a smaller bias current can be used. For example, the conventional TMR sensor 10 or 10' depicted in FIGS. 1A–1C utilizes a bias current on the order of four to five milliamps. In contrast, in one embodiment the TMR sensor 100 may use a bias current of between ten and one hundred microamps. Use of a lower bias current allows the TMR sensor 100 to have reduced power dissipation, less sensor heating and lower Johnson thermal noise, which are desirable.

The TMR sensor 100 also has an increased signal. As discussed above, the TMR sensor 100 has two TMR junctions, one at each edge of the free layer 110. The bias current is also driven parallel to the plane of the page, in the direction depicted by arrow 125. This is because the bias current is driven between the leads 120 and 122 As a result, the current passes through two TMR junctions when traveling between the leads 120 and 122. Thus, the signal from the TMR sensor 100 may be twice what it would be for the conventional TMR sensor 10 or 10', depicted in FIGS. 1A–1C, because the TMR sensor 100 of FIGS. 3A and 3B includes two TMR junctions rather than just one. Thus, the TMR sensor 100 has an increased signal, which makes the TMR sensor 100 more suitable for higher areal density recording application.

In addition, in a preferred embodiment, the free layer 110 is single domain, making magnetic biasing for the TMR sensor 100 unnecessary. If the free layer 110 has multiple magnetic domains, then when the magnetization of the free layer 110 responds to an external magnetic field, the walls of the domains move. This domain wall motion can be a source of non-repeatable noise, which is undesirable. This noise can be avoided by ensuring that the free layer 110 has a single magnetic domain. In GMR sensors, the free layer is magnetically biased by hard magnets in order to ensure that the free layer has a single domain.

However, if the free layer 110 is small enough, the free layer will be single domain. In general, a free layer 110 will be single domain if its width, w, approximately less than or equal to ten times the exchange length for the material of which the free layer 110 is made. For a free layer 110 that is made of permalloy (NiFe having approximately nineteen percent Fe), the. free layer 110 will be single domain if the free layer 110 has a width that is less than or equal to approximately 0.1 micron. Thus, in a preferred embodiment, the free layer 110 is less than or equal to 0.1 micron in length. As a result, in a preferred embodiment, the free layer 110 is single domain without magnetic biasing. In order to set the free layer single domain direction to be perpendicular to the direction of magnetization of the hard magnetic layers 116 and 118, an external field which is less than the coercivities of the hard magnetic layers 116 and 118, respectively, can be applied at room temperature to set the free layer magnetization direction.

Also in a preferred embodiment, the free layer 110 having a width of approximately 0.1 micron is suitable for reading a magnetic material having a recording density of approximately one hundred $Gb/in^2$. The size of a bit can be described by the bits per inch ("BPI") along the track and the tacks per inch ("TPI"). The BPI/TPI decreases for higher areal densities. Thus, a smaller bit aspect ratio is also beneficial because the signal to noise ratio decreases for smaller bit aspect ratios. It is currently believed that a BPI/TPI of approximately four and a track pitch of about 0.2 micron will result in an areal density of approximately one hundred $Gb/in^2$.

The width of the free layer 110 is preferably approximately one-half of the track pitch. Thus, a free layer 110 having a width of approximately 0.1 micron should be suitable for a track pitch of approximately 0.2 micron and, therefore, an areal density of approximately one hundred $Gb/in^2$. Thus, in a preferred embodiment, the TMR sensor 100 is suitable for use with a one hundred $Gb/in^2$ media when the free layer 110 has a width that is small enough to ensure that the free layer 110 is single domain. Moreover, as discussed above, the TMR sensor 100 has a higher MR ratio, while having a higher data transfer rate. Thus, the TMR sensor 100 can be used for very high areal recording densities, including areal densities of one hundred $Gb/in^2$.

The TMR sensor 100 also has benefits over the conventional TMR sensor 10 and the more recently developed TMR sensor 50. The TMR sensor 100 omits the AFM layers present in the conventional TMR sensor 10 and the more recently developed TMR sensor 50. As discussed above, the relatively high coercivity of the hard magnetic layers 116 and 118 effectively pins the magnetizations of the hard magnetic layers 116 and 118, obviating the need for AFM layers. Because the AFM layers are omitted, many of the problems due to the presence of AFM layers are avoided.

For example, the potentially corrosive AFM layers are no longer present to corrupt other layers of the device. In addition, annealing the AFM layers at high temperature is unnecessary, reducing the inter-diffusion between the layers of the TMR sensor 100. The concerns due to the blocking temperatures of the AFM layers are also not present. In particular, if the local temperature of portions of the TMR sensor 100 reach one hundred to two hundred degrees Celsius, the directions of the magnetizations of the hard magnetic layers 116 and 118 may not be adversely affected.

Figure 1C:
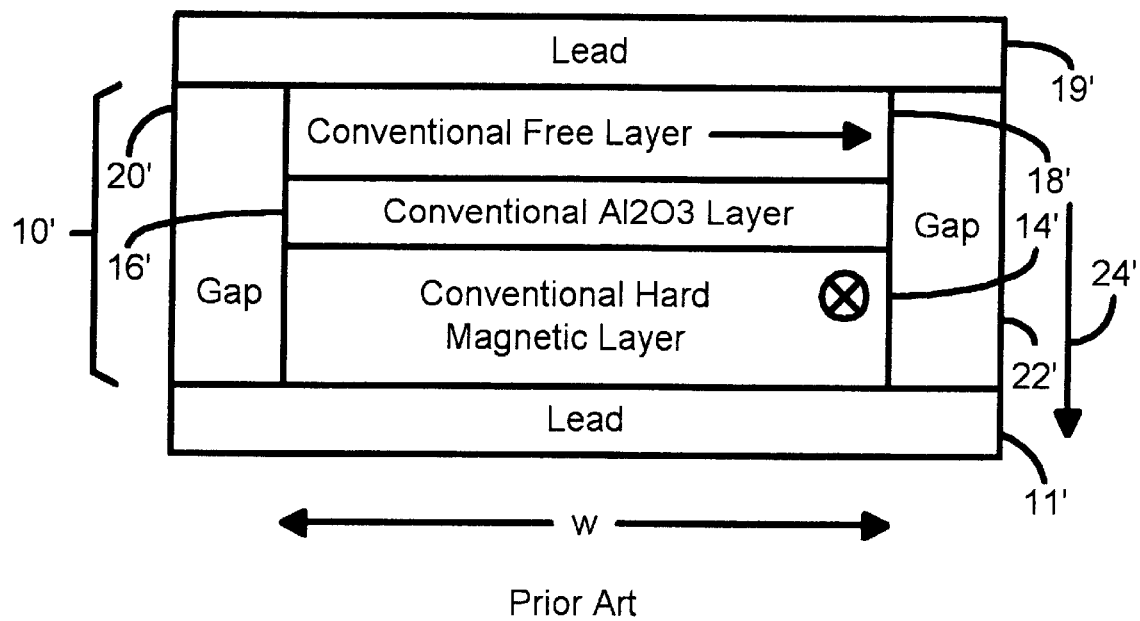
FIG. 1C is a diagram of another conventional TMR sensor as viewed from an air-bearing surface.

Furthermore, the TMR sensor 100 has an additional advantage over the conventional TMR sensor 10' depicted in FIG. 1C. Referring to FIG. 1C, the hard magnetic layer 14' of the conventional TMR sensor 10' is typically magnetically coupled to the free layer 18'. For a very thin barrier layer 16' (less than ten Angstroms thick) or a pinhole-like barrier layer 16', this coupling could be even stronger and is most likely to be antiferromagnetic. Thus, the ability of the free layer 18' to respond to an external magnetic field is reduced.

In contrast, the hard magnetic layers 116 and 118 depicted in FIG. 3B exert a magnetic field on the free layer 110 that is approximately zero. This is due to the orientation between the free layer 110 and each of the hard magnetic layers 116 and 118, as well as the configurations of each of the magnetic layers 116 and 118. The thicknesses and widths of the hard magnetic layers 116 and 118 are small in comparison to the height of the hard magnetic layers. This is because the heights of the hard magnetic layers 116 and 118 are into the plane of the page in FIG. 3B. The height of each of the hard magnetic layers can be much greater than the free layer stripe height, h. It can be shown that for a rectangular slab of material in which the width is much less than the height, the magnetic field in a direction perpendicular to both the height and the thickness of the slab is approximately zero. Thus, the magnetic field generated by each of the hard magnetic layers 116 and 118 in a direction perpendicular to both the thickness and the height of each of the hard magnetic layers 116 and 118 is approximately zero. Thus, the hard magnetic layers 116 and 118 generate a field in a direction-parallel or antiparallel to the direction of flow of current 125 that is approximately zero. As a result, the hard magnetic layers 116 and 118 exert very little magnetic field on the free layer 110. Thus, there may be very little interlayer coupling between the hard magnetic layers 116 and 118 and the free layer 110. Consequently, the free layer 110 is free to respond to an external magnetic field.

The TMR sensor 100 has an additional advantage over the conventional TMR sensors 10 and 10'. The edges of the free layer 110 are relatively vertical. In a preferred embodiment, the edges of the free layer 110 are more vertical than as shown in FIG. 3B. Thus, the portions of the barrier layers 112 and 114 through which current will pass are also relatively vertical. When the ABS for the TMR sensor 100 is prepared by lapping, the lapping will also be performed in a vertical direction, perpendicular to the direction of current 125. This is because the TMR sensor 100 is typically lapped from one gap 104 or 124 to the other gap 124 or 104, respectively. Thus, the hard magnetic layers 116 and 118 and the free layer 110 will tend to smear vertically during lapping. This is the same direction as the portions of the barrier layers 112 and 114 through which current will pass. Thus, the hard magnetic layers 116 and 118 and the free layer 110 will tend not to smear across these portions of the barrier layers 112 and 114. As a result, the TMR sensor 100 is less likely to be shorted during manufacturing than the conventional TMR sensor 10 and 10'.

In addition to the above-mentioned benefits, the TMR sensor 100 may also be relatively simple to manufacture. This simplicity comes in part from the fact that the TMR sensor 100 is in a CIP configuration and can thus be manufactured using very similar techniques to conventional CIP GMR sensors. In other words, it is relatively simple to integrate the processing of the TMR sensor 100 into current processing technologies. In addition, the TMR sensor 100 has fewer layers than the conventional TMR sensor 10 and the recently developed TMR sensor 50. Because the AFM layer is omitted, processing is simplified both because fewer layers are required and because annealing of the AFM layers can be omitted.

Figure 4:
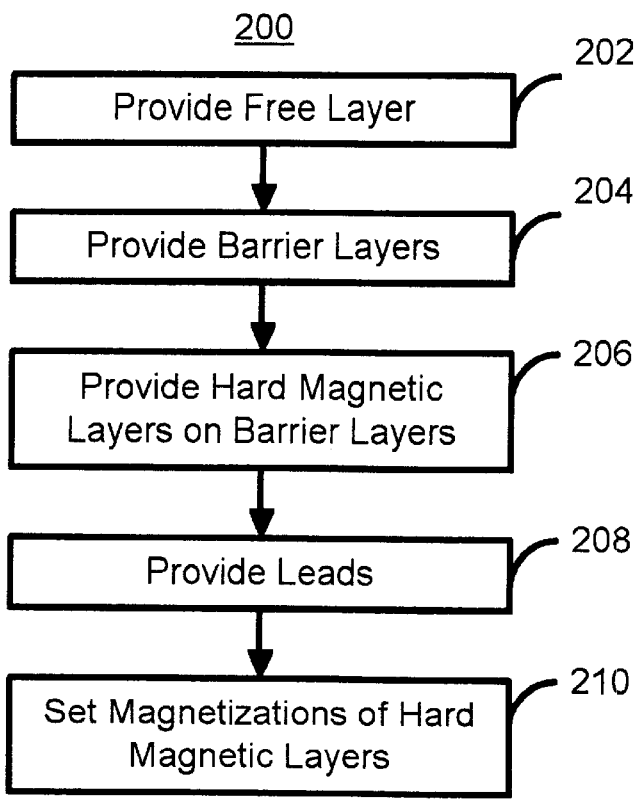
FIG. 4 is a high-level flow chart of a method in accordance with the present invention for providing a TMR sensor in accordance with the present invention.

To more particularly describe this advantage of the present invention, refer to FIG. 4, which depicts a high-level flow chart of a method 200 for providing a TMR sensor in accordance with the present invention. The free layer 110 is provided, via step 202. The free layer 110 is preferably made up of approximately twenty to three hundred Angstroms of permalloy. The barrier layers 112 and 114 are provided, via step 204. The barrier layers 112 and 114 are preferably formed of five to twenty Angstroms of aluminum oxide. The barrier layers 112 and 114 will preferably remain at the edges of the free layer. The hard magnetic layers 116 and 118 are. provided, via step 206. The hard magnetic layers 116 and 118 are provided on the barrier layers 112 and 114. The hard magnetic layers 116 and 118 are preferably between thirty and three hundred Angstroms of a magnetic material having a relatively high coercivity and, in a preferred embodiment, having a high spin polarization. The leads are provided, via step 208, allowing current to be driven to and from the TMR sensor 100. The direction of magnetization of each of the hard magnetic layers 116 and 118 is set, via step 310. In a preferred embodiment, step 310 is accomplished by applying a high magnetic field, for example on the order of ten thousand Oersted, to the TMR sensor 100. Step 310 can be performed at or near room temperature.

Figure 5:
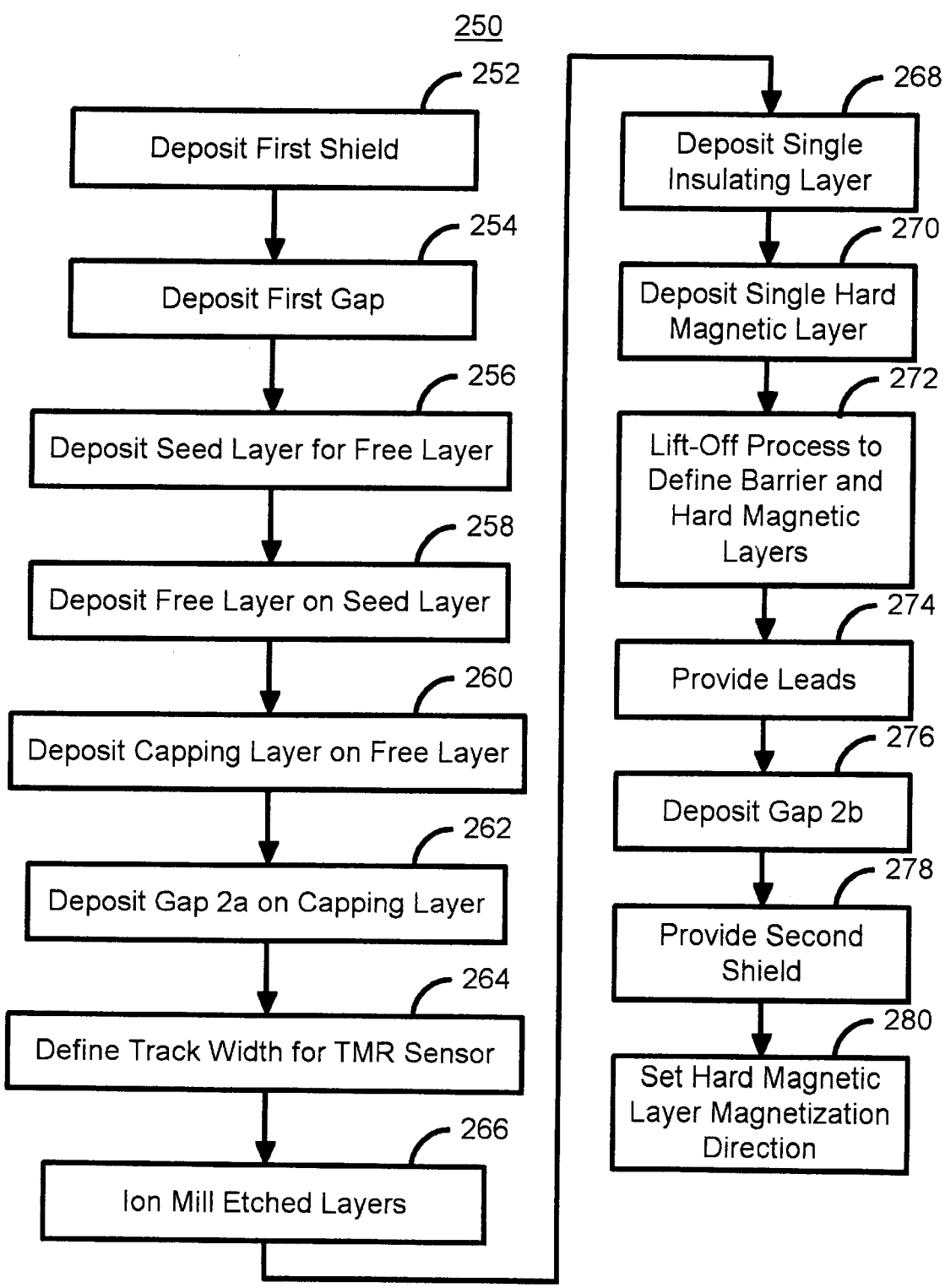
FIG. 5 is a more detailed flow chart of a method in accordance with the present invention for providing a TMR sensor in accordance with the present invention.
Figure 6A:
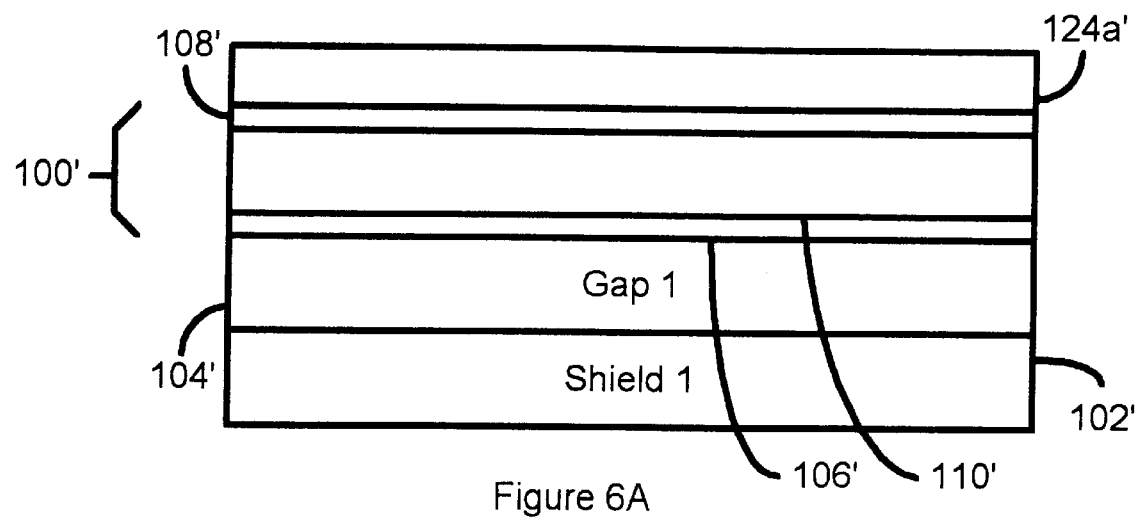
FIGS. 6A through 6G depict one embodiment of a TMR sensor in accordance with the present invention during fabrication.

FIG. 5 depicts a more detailed flow chart of a method 250 in accordance with the present invention. The method 250 will also be described in conjunction with FIGS. 6A through 6G, which depict another embodiment of a TMR sensor 100' during processing. Referring to FIGS. 5 and 6A–6G, the first shield is provided, via step 252. The first gap is provided on the first shield, via step 254. An optional seed layer for the free layer can then be deposited, via step 256. Preferably, the seed layer is composed of approximately twenty to fifty Angstroms of Tantalum. The material for the free layer is then deposited, via step 258. An optional capping layer can then be provided on the free layer, via step 260. A first portion of the second gap, called gap 2a, is then deposited on the capping layer, via step 262. The gap 2a protects the free layer during subsequent processing, such as the ion milling, discussed below. FIG. 6A depicts the TMR sensor 100' after deposition of the gap 2a layer, 124a'. Also shown are the first shield 102', the first gap 104', the optional seed layer 106', the free layer 110' and the optional capping layer 108'.

Figure 6B:
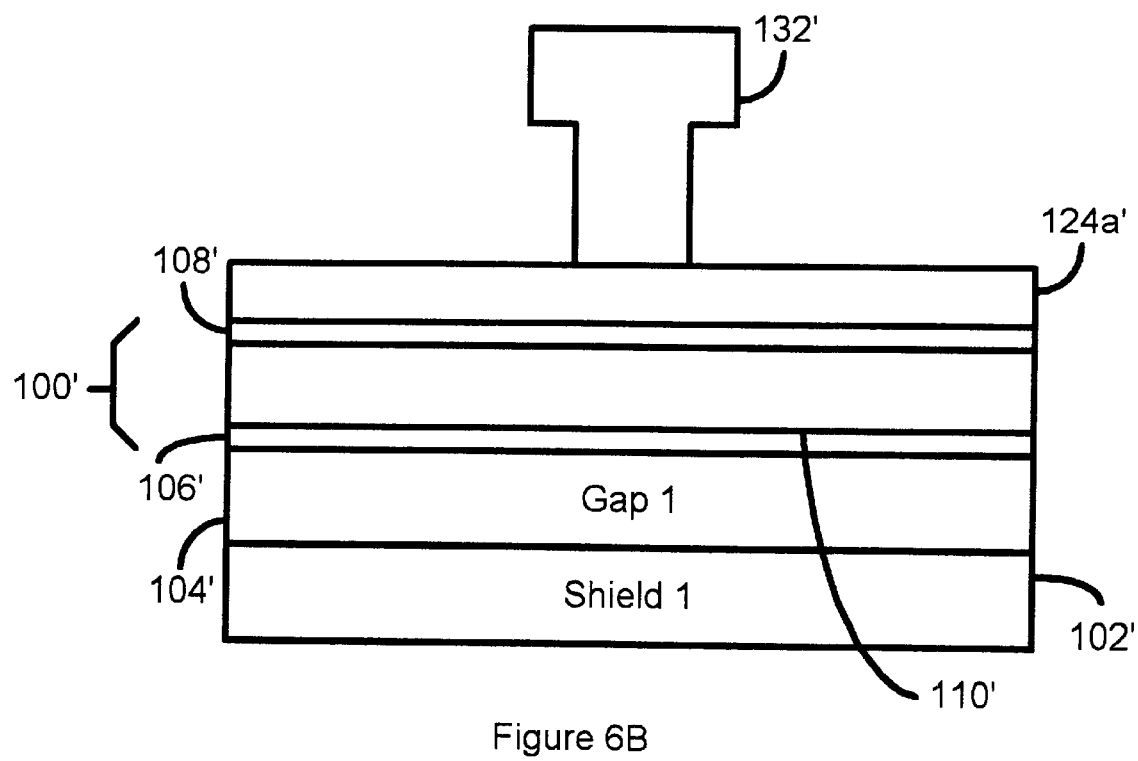
Figure 6C:
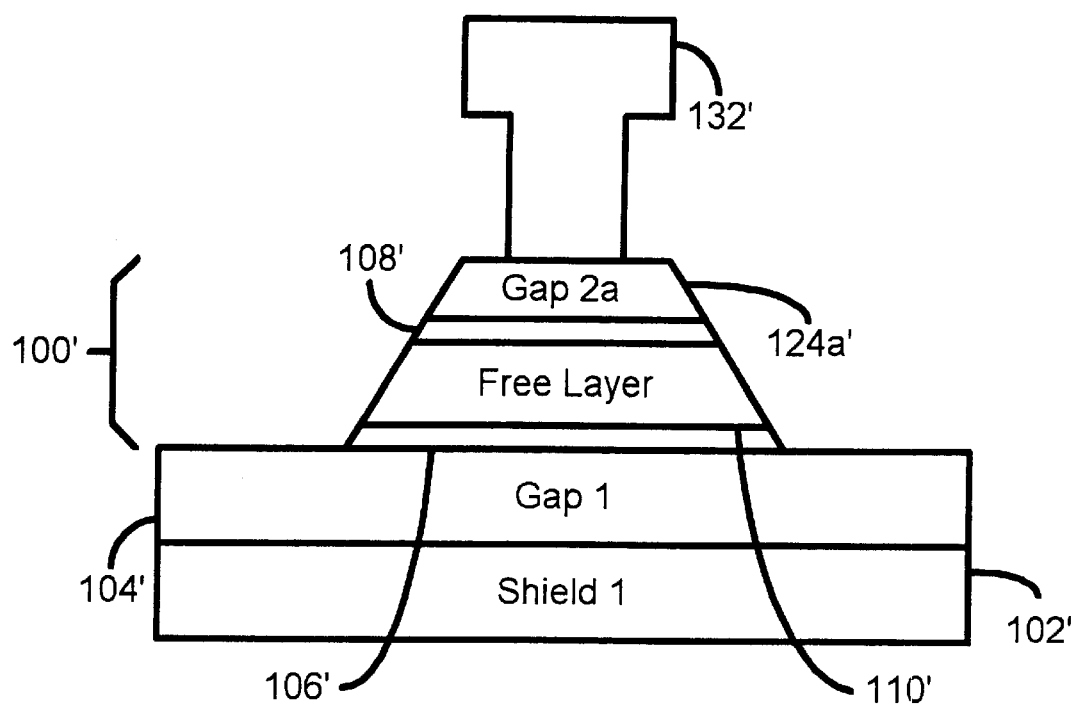

The track width is defined, via step 264. Step 264 preferably includes providing a bilayer photoresist structure 132', as depicted in FIG. 6B. The gap 2a layer 124a', the capping layer 108', the free layer 110' and the seed layer 106' are then etched using the bilayer photoresist structure 132' as a mask, also in step 264. Thus, the width desired for the free layer 110' is determined using step 264. These layers 106', 110', 108' and 124a' are then ion milled to allow the TMR junctions to be formed at the edges of the free layer 110', via step 266. FIG. 6C depicts the TMR sensor 100' after the track width has been defined in step 264 and the free layer has been milled in step 266.

Figure 6D:
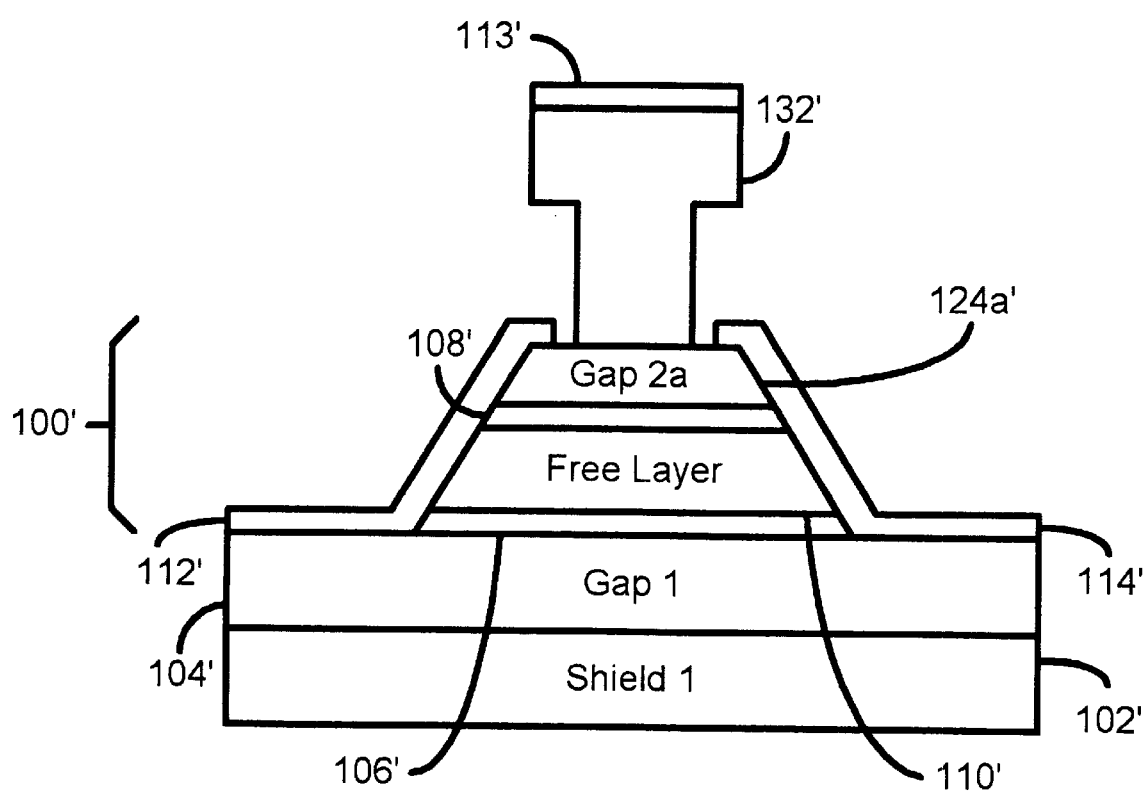
Figure 6E:
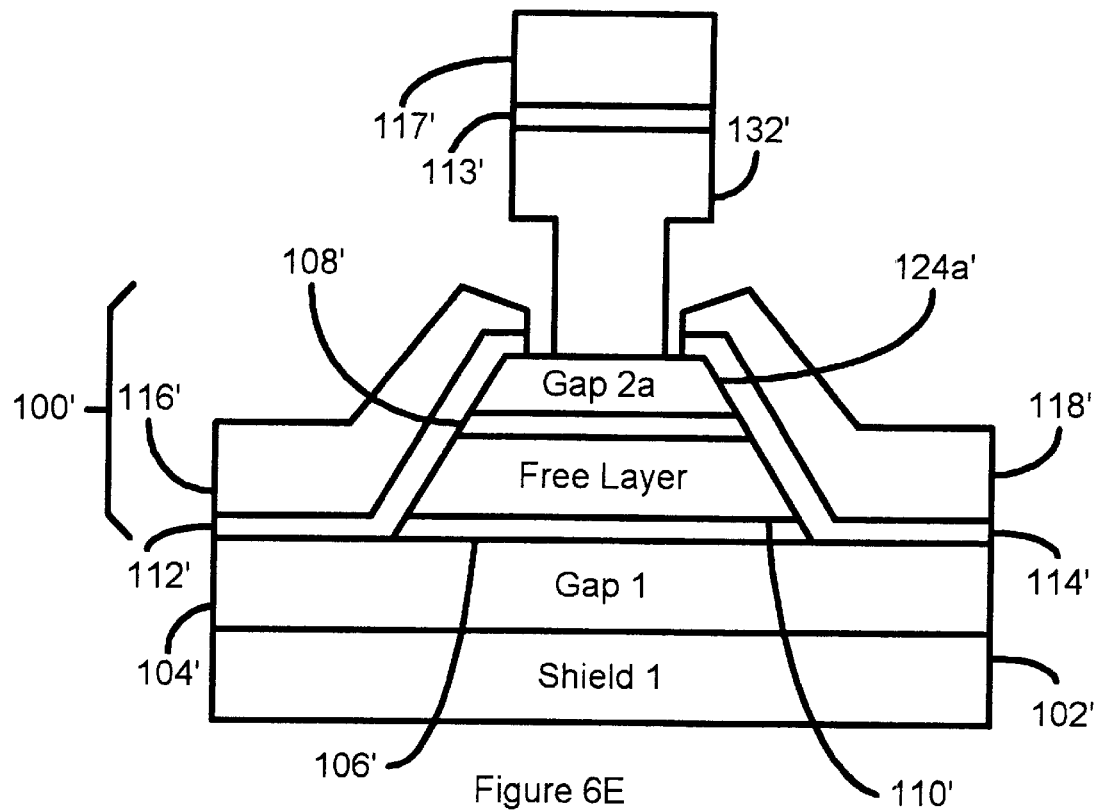

A single insulating layer that will form the barrier layers is then deposited, via step 268. FIG. 6D depicts the TMR sensor 100' after the insulating layer has been deposited. The single insulating layer is shown as being made up of layers 112' and 114' that will be the barrier layers for the TMR sensor 100' and the layer 113' on the bilayer photoresist structure 132'. A single hard magnetic layer that will become the hard magnetic layers for the TMR sensor 100' is deposited, via step 270. FIG. 6E depicts the TMR sensor 100' after the step 270 has been completed. The single hard magnetic layer that will be used for the hard magnetic layers is indicated by layers 116', 117' and 118'. Thus, the portions 113' and 117' of the barrier layer and the magnetic layer, respectively, are on the bilayer photoresist structure 132'.

Figure 6F:
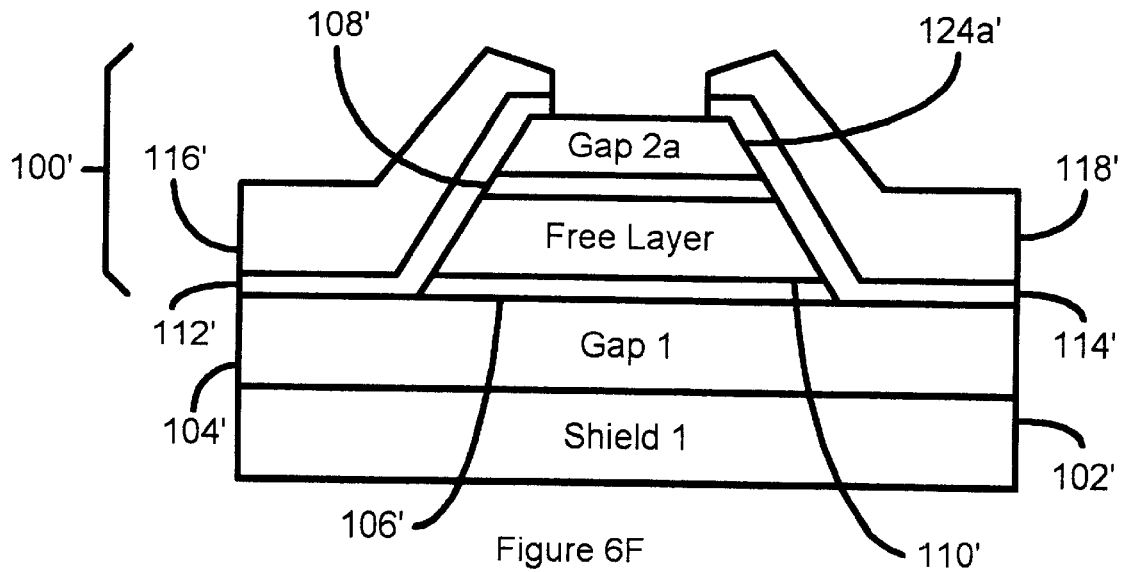

A lift-off process is then performed, via step 272. The lift-off process performed in step 272 removes the bilayer photoresist structure 132'. Thus, the portions 113' and 117' of the barrier layer and the hard magnetic layer, respectively, are also removed. FIG. 6F depicts the TMR sensor 100' after the lift-off process is performed in step 272. As can be seen in FIG. 6F, two barrier layers 112' and 114' and the two hard magnetic layers 116' and 118' remain. Thus, TMR junctions are formed at the edges of the free layer 110'. A first TMR junction is formed by an edge of the free layer 110', the first barrier layer 112' and the first hard magnetic layer 116', while a second TMR junction is formed by another edge of the free layer 110', the second barrier layer 114' and the second hard magnetic layer 118'. The leads are provided, via step 274.

Figure 6G:
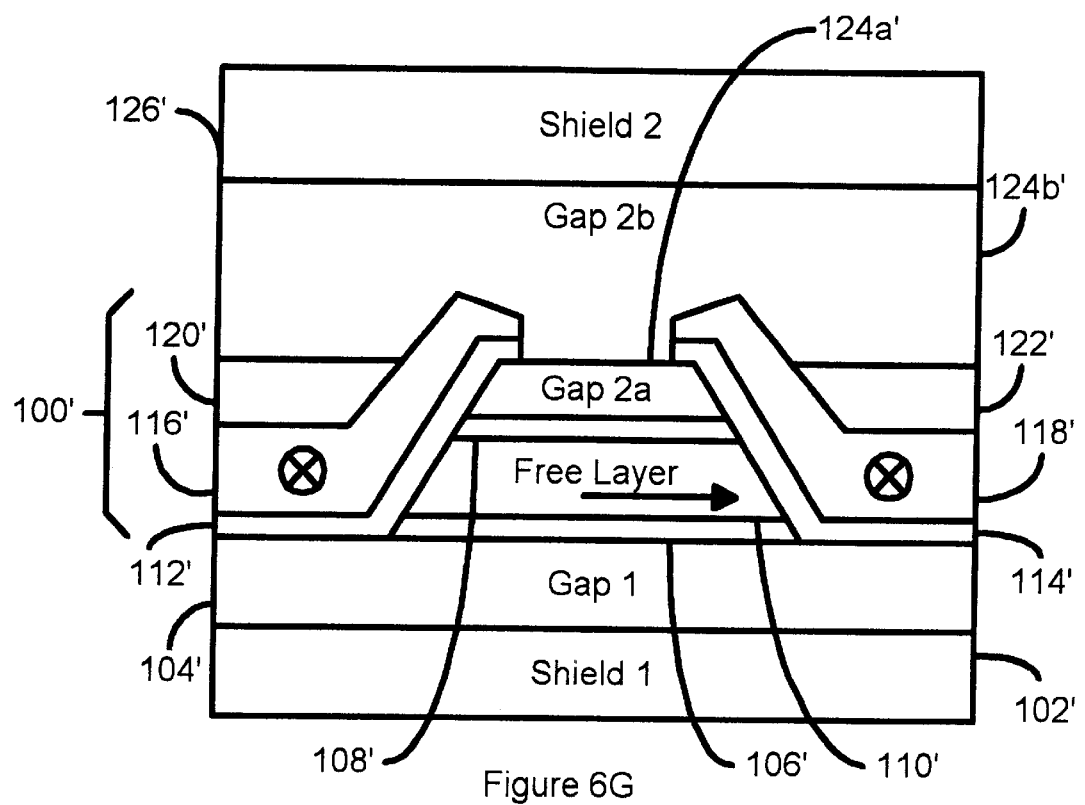

A second portion of the second gap, termed gap 2b, is then deposited, via step 276. The second shield is also provided, via step 278. The direction of magnetization of each of the hard magnetic layers 116' and 118' is set in step 280. Preferably, step 280 is performed by applying a high magnetic field, on the order of approximately ten thousand Oersted or more, at room temperature. The completed TMR sensor 100', including the gap 2b 124b' and the second shield 126', is depicted in FIG. 6G. The leads to the TMR sensor 100' are also depicted in FIG. 6G, however the leads structure of Ta/Au/Ta for GMR heads could also be used to make contact to the free layer 110' in this embodiment. The TMR sensor 100' has essentially the same benefits as the TMR sensor 100.

Figure 6H:
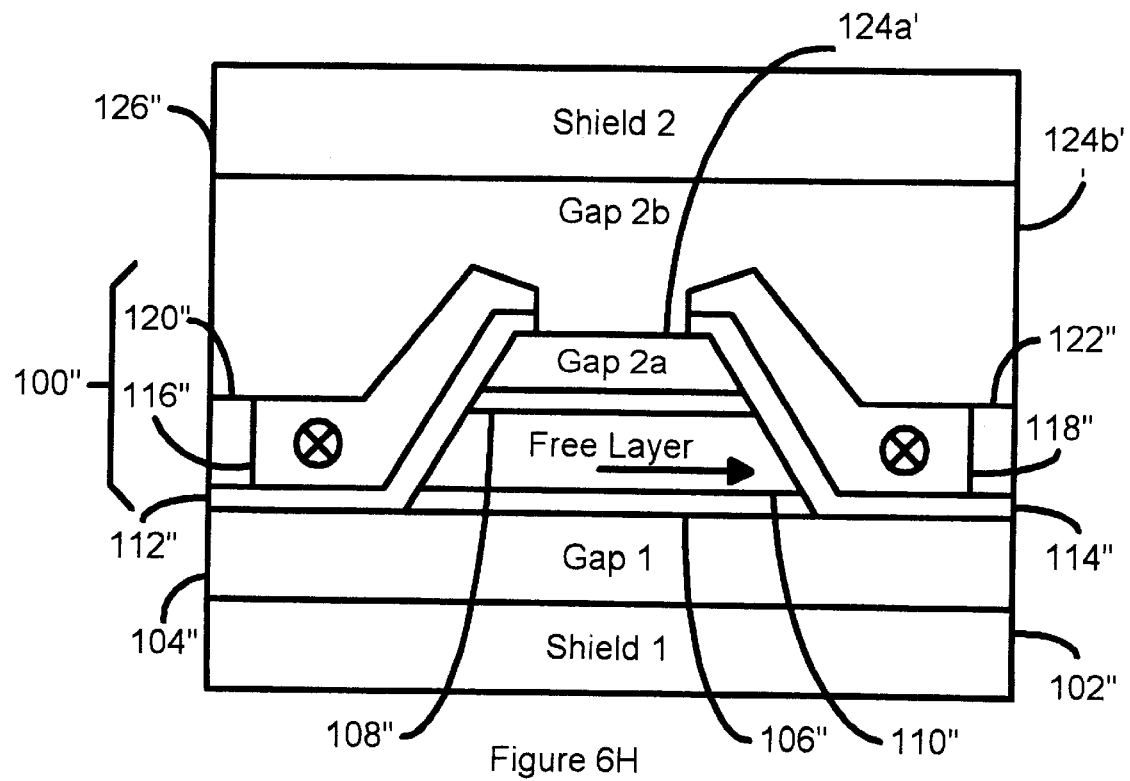
FIG. 6H depicts another embodiment of a TMR sensor in accordance with the present invention.

FIG. 6H depicts another embodiment of the TMR sensor 100". The TMR sensor 100" is substantially the same as the TMR sensors 100 and 100'. Therefore, the TMR sensor 100" has substantially the same benefits as the TMR sensors 100 and 100'. However, the leads 120" and 122" are coupled to the outside edge of the TMR sensor 100", rather than being above the hard magnetic layers 116" and 118". Furthermore, although the leads 120 and 122, 120' and 122' and 120" and 122" are depicted as touching the hard magnetic layers 116 and 118, 116' and 118' and 116" and 118" in FIGS. 3B, 6G and 6H, respectively, the leads 120 and 122, 120' and 122' and 120" and 122" are preferably a non-magnetic metal. Furthermore, although the leads 120 and 122, 120' and 122' and 120" and 122" are depicted in FIGS. 3B, 6G and 6H are as seen from the air-bearing surface, the leads 120 and 122, 120' and 122' and 120" and 122" need not reach the air-bearing surface.

Thus, the methods 200 and 250 used to provide the TMR sensors 100, 100' and 100" are similar to techniques used in forming conventional GMR sensors. Thus, the methods 200 and 250 can be easily integrated into current processing technology. In addition, the methods 200 and 250 avoid providing and annealing AFM layers, both simplifying manufacturing of the TMR sensors 100, 100' and 100" and improving the TMR sensors 100, 100' and 100". Furthermore, although not specifically discussed in the context of the methods 200 and 250, the ABS for the TMR sensors 100, 100' and 100" may also be lapped. Because of the configuration of the TMR sensors 100, 100' and 100", the lapping performed may not short the TMR sensors 100, 100' and 100". The methods 200 and 250 can provide a superior TMR sensor 100, 100' or 100" having a more uniform bias current, having a higher signal, that do not require an AFM layer to bias the magnetization of the hard magnetic layers and that are suitable for use in high areal density recording applications, including for areal densities of one hundred Gb/in$^2$. The methods 200 and 250 are also relatively simple to carry out, facilitating processing of the TMR sensors 100, 100' and 100".

A method and system has been disclosed for providing a TMR sensor which is suitable for high areal density recording applications and is relatively simple to manufacture. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetoresistive sensor for reading data from a recording media comprising:

at least one barrier layer;

a free layer having at least one edge, the at least one edge of the free layer being adjacent to the at least one barrier layer, the free layer being ferromagnetic and having a free layer coercivity; and at least one hard magnetic layer, the at least one hard magnetic layer having a coercivity greater than the free layer coercivity, the at least one barrier layer being disposed between the at least one hard magnetic layer and the free layer;

the at least one barrier layer allowing tunneling of charge carriers between the at least one hard magnetic layer and the free layer;

wherein the at least one barrier layer is at least one insulating barrier layer.

2. The magnetoresistive sensor of claim 1 wherein the at least one hard magnetic, layer includes CoFe.

3. The magnetoresistive sensor of claim 1 wherein the at least one hard magnetic layer includes CoCr.

4. The magnetoresistive sensor of claim 1 wherein the at least one hard magnetic layer includes CoCrPt.

5. The magnetoresistive sensor of claim 1 wherein the free layer is exposed to an external field during use and wherein the coercivity of the hard magnetic layer is greater than the external field.

6. A magnetoresistive sensor for reading data from a recording media comprising:

at least one barrier layer;

a free layer having at least one edge, the at least one edge of the free layer being adjacent to the at least one barrier layer, the free layer being ferromagnetic and having a free layer coercivity; and at least one hard magnetic layer, the at least one hard magnetic layer having a coercivity greater than the free layer coercivity, the at least one barrier layer being disposed between the at least one hard magnetic layer and the free layer;

the at least one barrier layer allowing tunneling of charge carriers between the at least one hard magnetic layer and the free layer;

wherein the at least one barrier layer includes a first barrier layer and a second barrier layer;

wherein the free layer is disposed between the first barrier layer and the second barrier layer;

wherein the at least one hard magnetic layer includes a first hard magnetic layer and a second hard magnetic layer, the first barrier layer being disposed between the first hard magnetic layer and the free layer, the second barrier layer being disposed between the second hard magnetic layer and the free layer, the first barrier layer allowing tunneling of charge carriers between the first hard magnetic layer and the free layer, the second barrier layer allowing tunneling of charge carriers between the second hard magnetic layer and the free layer.

7. The magnetoresistive sensor of claim 6 wherein the free layer further has a width, the width being less than or equal to approximately 0.1 micrometers.

8. The magnetoresistive sensor of claim 6 wherein the at least one edge of the free layer further includes a first edge and a second edge, the first barrier layer being adjacent to the first edge and the second barrier layer being adjacent to the second edge.

9. The magnetoresistive sensor of claim 6 wherein the first spacer layer and the second spacer layer are oxides.

10. The magnetoresistive sensor of claim 6 wherein the first spacer layer and the second spacer layer are nitrides.

* * * * *